United States Patent
Chen et al.

(10) Patent No.: US 12,322,678 B2
(45) Date of Patent: Jun. 3, 2025

(54) ENCAPSULATION STRUCTURE AND ENCAPSULATION METHOD OF POWER MODULE

(71) Applicant: Huawei Technologies Co., Ltd., Shenzhen (CN)

(72) Inventors: Huibin Chen, Shanghai (CN); Haiyan Liu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 465 days.

(21) Appl. No.: 17/818,518

(22) Filed: Aug. 9, 2022

(65) Prior Publication Data

US 2023/0268251 A1   Aug. 24, 2023

(30) Foreign Application Priority Data

Aug. 11, 2021   (CN) .......................... 202110919986.2

(51) Int. Cl.
| | |
|---|---|
| *H01L 23/473* | (2006.01) |
| *B23K 26/24* | (2014.01) |
| *H01L 21/48* | (2006.01) |
| *H01L 25/11* | (2006.01) |
| *H02M 7/00* | (2006.01) |
| *B23K 101/36* | (2006.01) |

(52) U.S. Cl.
CPC ............ *H01L 23/473* (2013.01); *B23K 26/24* (2013.01); *H01L 21/4882* (2013.01); *H01L 25/115* (2013.01); *H02M 7/003* (2013.01); *B23K 2101/36* (2018.08)

(58) Field of Classification Search
CPC . H01L 23/473; H01L 21/4882; H01L 25/115; H01L 23/3672; B23K 26/24; B23K 2101/36; B23K 2101/006; B23K 2103/10; B23K 2103/12; B23K 2103/52; B23K 20/122; B23K 20/233; B23K 20/2333; B23K 26/324; B23K 26/32; H02M 7/003; B60L 15/007; B60L 50/64; H05K 7/20254; H05K 7/20927
USPC ........................................................ 257/323
See application file for complete search history.

(56) References Cited

U.S. PATENT DOCUMENTS 11,895,810 B2 *   2/2024   Manninen .............. H05K 7/209

FOREIGN PATENT DOCUMENTS

| EP | 1058349 A1 | 12/2000 |
|---|---|---|
| EP | 2844051 A2 | 3/2015 |

(Continued)

*Primary Examiner* — Tan N Tran
(74) *Attorney, Agent, or Firm* — Slater Matsil, LLP

(57) ABSTRACT

An encapsulation structure of a power module is disclosed in this application, which includes a power module and a liquid cooler. The power module includes a power module body, a metal baseplate, and heat dissipation finned tubes. A front side of the metal baseplate is connected to the power module body, and a back side of the metal baseplate is connected to the heat dissipation finned tubes. The metal baseplate has a protrusion part protruding. There are a plurality of grooves on a fluid pipe of the liquid cooler, a cavity exists between two adjacent grooves of the plurality of grooves, and the cavity is configured to communicate the two adjacent grooves. The power module body is lapped on the groove, a back side of the protrusion part is in contact with an edge surface of the groove, and the heat dissipation finned tubes are placed in the groove.

20 Claims, 6 Drawing Sheets

(56) References Cited

FOREIGN PATENT DOCUMENTS

| | | | |
|---|---|---|---|
| GB | 2539834 | A | 12/2016 |
| JP | 2008218718 | A | 9/2008 |
| WO | 2013178727 | A1 | 12/2013 |

* cited by examiner

ENCAPSULATION STRUCTURE AND ENCAPSULATION METHOD OF POWER MODULE

CROSS-REFERENCE TO RELATED APPLICATIONS

This application claims priority to Chinese Patent Application No. 202110919986.2, filed on Aug. 11, 2021, which is hereby incorporated by reference in its entirety.

TECHNICAL FIELD

Embodiments of this application relate to the field of vehicles, and in particular, to an encapsulation structure and an encapsulation method of a power module.

BACKGROUND

To deal with environmental problems, because a carbon neutrality target is proposed, the electric vehicle industry is booming. Accordingly, a requirement for a module explosively grows. A power module provided by a module provider needs to have a higher power density, lower costs, and a longer service life, to save resources and improve industrial efficiency.

For the power density of the power module, the module provider starts to encapsulate the power module and a cooler, and seals the power module and a fluid path of the cooler through welding or sealing and crimping, to form a whole. A commonly used manner includes: Local high-energy heating is performed by using a laser beam, to establish a welding pool and a welding region. Alternatively, a sealing ring is added between the power module and the cooler, and the module is pressed against the cooler by using a screw and a damper, to finally form a sealed heat dissipation fluid path.

However, in the former solution of the foregoing two solutions, because a power pin of the power module generally needs to extend from a side, a continuous laser processing optical path cannot be formed. In the latter solution of the foregoing two solutions, the sealing ring may be hardened and cracked due to aging of the sealing ring or a surface on which the power module is pressed against the cooler is deformed, to generate a gap, and consequently local leakage is caused and a risk of an electrical short circuit is caused. As a result, a sealed fluid path with high reliability cannot be provided in the two solutions. Therefore, how to provide a more complete and reliable sealed fluid path when the power module and the cooler are assembled becomes a problem that needs to be urgently resolved.

SUMMARY

Embodiments of this application provide an encapsulation structure and an encapsulation method of a power module. A power module body is lapped on a groove on a fluid pipe of a cooler, so that a protrusion part that is of a metal baseplate and that protrudes from the power module body is in contact with an edge surface of the groove, and heat dissipation finned tubes are placed in the groove. Then, a welded sealing ring is formed through laser welding. In this way, a complete sealed fluid path may be formed between the power module and the cooler, to improve sealing reliability of the encapsulation structure.

A first aspect of embodiments of this application provides an encapsulation structure of a power module, including the following.

To improve a power density of the power module, the power module and a liquid cooler may be encapsulated together to form a complete encapsulation structure. The power module includes three parts: a power module body, a metal baseplate, and heat dissipation finned tubes. A front side of the metal baseplate is connected to the power module body, a back side thereof is connected to the heat dissipation finned tubes, and the metal baseplate protrudes from the power module body. The liquid cooler includes a liquid inlet, a fluid pipe, and a liquid outlet. In addition, there are a plurality of grooves on the fluid pipe, a cavity exists between adjacent grooves, and the cavity is configured to communicate the plurality of grooves. When the power module is encapsulated, the power module body needs to be lapped on the groove, so that a protrusion part of the metal baseplate is in contact with an edge of the groove, and the heat dissipation finned tubes are placed in the groove. Then, a front weld is obtained through welding on a front side of the protrusion part, a back weld is obtained through welding on a part on the back side of the metal baseplate other than a back side of the protrusion part, and the front weld and the back weld form a welded sealing ring, to finally form a complete encapsulation structure.

In the foregoing encapsulation structure, the power module body is placed on the groove, and the heat dissipation finned tubes are inserted into the groove to be in direct contact with heat dissipation liquid. This may greatly improve a heat dissipation function of the power module. In addition, the metal baseplate has a protrusion part protruding from the power module body, to provide a welding side for front welding. The welded sealing ring is formed by combining front welding and back welding, and a complete sealed structure can be obtained without using a sealing ring, to avoid local leakage. In this way, a complete sealed fluid path is formed between the power module and the cooler, to improve sealing reliability of the entire encapsulation structure.

In an optional implementation, a power pin exists on a side of the power module body, and is a port for connecting the power module to an external circuit. Existence of the power pin brings a great difficulty to front welding. Therefore, the protrusion part (the welding side for front welding) of the metal baseplate is located on a side other than the side on which the power pin is located. The side on which the power pin is located is sealed through back welding. In this way, front welding is performed on the protrusion part, back welding is performed on the side on which the power pin is located, and the two manners are combined to form the welded sealing ring. This greatly reduces a welding difficulty.

In an optional implementation, the power module body is a square structure, the protrusion part is located on a first side and a second side that are parallel to each other and that are of the power module body, and the power pin is located on a third side and a fourth side that are perpendicular to the first side and the second side. In other words, finally formed front welds are parallel to each other, finally formed back welds are parallel to each other, and the front weld and the back weld are perpendicular to each other. In this way, the front welds and the back welds form weld overlapping regions, to form the complete welded sealing ring.

In an optional implementation, the back weld exists on the back side of the metal baseplate, and is formed through back welding. It may be understood that front welding cannot be performed on the side on which the power pin is located. Therefore, the weld formed through back welding exists on a first part and a second part on the back side of the metal baseplate, the first part is close to the third side, and the second part is close to the fourth side. The first part and the second part respectively overlap the back side of the protrusion part to form the welded sealing ring. In this way, a welding difficulty can be reduced, and welding efficiency can be improved.

In an optional implementation, a rib is further disposed on the front side of the protrusion part, and the rib is configured to enhance strength of the protrusion part, to ensure welding strength required for front welding, and improve welding efficiency.

In an optional implementation, widths of the protrusion part and both the first part and the second part on the back side of the metal baseplate are all between 4 millimeters and 12 millimeters, and thicknesses thereof are all between 0.5 millimeter and 4 millimeters, to ensure welding quality and improve welding reliability.

In an optional implementation, a width of the weld obtained through either front welding or back welding needs to be greater than or equal to 2 millimeters, to ensure welding reliability.

In an optional implementation, on the back side of the metal baseplate, the heat dissipation finned tubes are distributed in a rectangle. This facilitates distribution of the back weld, so that the welded sealing ring is more easily formed. The heat dissipation finned tube may be a circular finned tube, a conical finned tube, or a rhombic finned tube, to provide more diversified finned tube choices for the power module.

A second aspect of embodiments of this application provides an encapsulation method of a power module, including the following.

The power module includes three parts: a power module body, a metal baseplate, and heat dissipation finned tubes. A front side of the metal baseplate is connected to the power module body, a back side thereof is connected to the heat dissipation finned tubes, and the metal baseplate protrudes from the power module body. A liquid cooler includes a liquid inlet, a fluid pipe, and a liquid outlet. In addition, there are a plurality of grooves on the fluid pipe, a cavity exists between adjacent grooves, and the cavity is configured to communicate the plurality of grooves. When the power module is encapsulated, the power module body is placed in the groove on the fluid pipe, so that a back side of a protrusion part of the metal baseplate is in contact with an edge surface of the groove, and the heat dissipation finned tubes included in the power module are placed in the groove. Then, the power module and the liquid cooler are fastened together by using a fixture, a front weld is obtained by processing a front side of the protrusion part, and a back weld is obtained by processing a part on the back side of the metal baseplate other than the back side of the protrusion part. Finally, the front weld and the back weld form a welded sealing ring.

In the foregoing encapsulation structure, the power module body is placed on the groove, and the heat dissipation finned tubes are inserted into the groove to be in direct contact with heat dissipation liquid. This may greatly improve a heat dissipation function of the power module. In addition, the metal baseplate has a protrusion part protruding from the power module body, to provide a welding side for front welding. The welded sealing ring is formed by combining front welding and back welding, and a complete sealed structure can be obtained without using a sealing ring, to avoid local leakage. In this way, a complete sealed fluid path is formed between the power module and the cooler, to improve sealing reliability of the entire encapsulation structure.

In an optional implementation, the power module body further includes a power pin, and the power pin is located on a side of the power module body other than a side on which the protrusion part is located.

In an optional implementation, the protrusion part is located on a first side and a second side of the power module body, and the power pin is located on a third side and a fourth side of the power module body. A plane on which the first side is located is parallel to a plane on which the second side is located, a plane on which the third side is located is parallel to a plane on which the fourth side is located, and the plane on which the first side is located is perpendicular to the plane on which the third side is located.

In an optional implementation, the back weld exists on a first part and a second part on the back side of the metal baseplate, the first part is close to the third side, and the second part is close to the fourth side. The first part and the second part respectively overlap the back side of the protrusion part.

In an optional implementation, before the front weld is obtained by processing the front side of the protrusion part, at least one rib further needs to be disposed on the front side of the protrusion part, and the rib is configured to enhance strength of the protrusion part.

In an optional implementation, widths of the protrusion part, the first part, and the second part are all between 4 millimeters and 12 millimeters, and thicknesses thereof are all between 0.5 millimeter and 4 millimeters.

In an optional implementation, widths of the front weld and the back weld are greater than or equal to 2 millimeters.

In an optional implementation, the heat dissipation finned tubes are distributed in a rectangle, and the heat dissipation finned tube is a circular finned tube, a conical finned tube, or a rhombic finned tube.

In an optional implementation, a processing manner of each of the front weld and the back weld is high-energy laser processing, friction stir welding processing, or ultrasonic welding processing.

A third aspect of embodiments of this application provides an inverter, including the encapsulation structure of a power module according to any one of the first aspect or the implementations of the first aspect, where the inverter is configured to convert a direct current into an alternating current.

A fourth aspect of embodiments of this application provides an alternating current motor drive system, where the alternating current motor drive system includes a direct current power supply, an inverter, and an alternating current motor. One side of the inverter is connected to the direct current power supply, and the other side thereof is connected to the alternating current motor. The inverter includes the encapsulation structure of a power module according to any one of the first aspect or the implementations of the first aspect. The inverter is configured to: convert, into an alternating current, a direct current provided by the direct current power supply, and provide the alternating current for the alternating current motor, to control a rotation speed of the alternating current motor.

DETAILED DESCRIPTION OF ILLUSTRATIVE EMBODIMENTS

Figure 1:
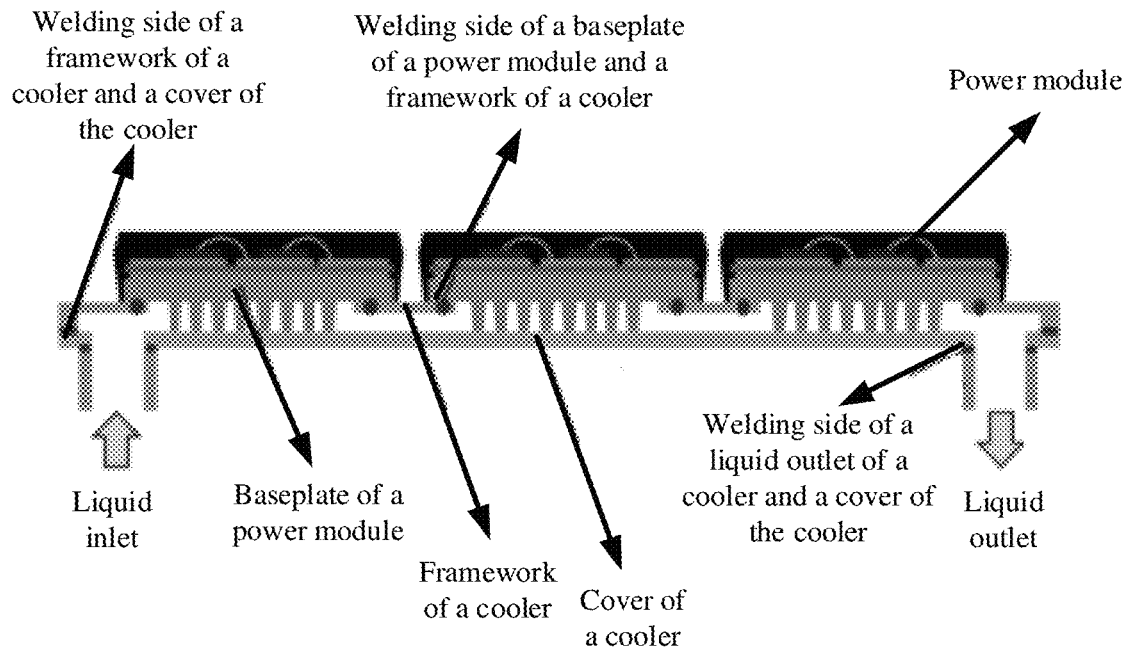
FIG. 1 is a schematic diagram of a structure of an encapsulation structure of a power module according to an embodiment of this application.

Embodiments of this application provide an encapsulation structure and an encapsulation method of a power module. A power module body is lapped on a groove on a fluid pipe of a cooler, so that a protrusion part that is of a metal baseplate and that protrudes from the power module body is in contact with an edge surface of the groove, and heat dissipation finned tubes are placed in the groove. Then, a welded sealing ring is formed through laser welding. In this way, a complete sealed fluid path may be formed between the power module and the cooler, to improve sealing reliability of the encapsulation structure.

The technical terms used in embodiments of the present invention are merely used to describe specific embodiments, but are not intended to limit the present invention. In this specification, singular forms "one", "this", and "the" are intended to simultaneously include plural forms unless otherwise specified in the context clearly. Further, the term "include" and/or "contain" used in this specification means presence of features, entireties, steps, operations, elements, and/or components, but does not preclude presence or addition of one or more other features, entireties, steps, operations, elements, and/or components.

In the appended claims, the corresponding structures, materials, actions, and equivalent forms (if any) of all apparatuses or steps and function elements are intended to include any structure, material, or action that is used to perform the function with reference to other explicitly required elements. The descriptions of the present invention are provided for the purpose of the embodiments and the descriptions, but are not intended to be exhaustive or limit the present invention to the disclosed form.

As a carbon neutrality concept is proposed, the electric vehicle industry continuously develops. Compared with a conventional fuel vehicle and a petroleum-electric hybrid vehicle, a pure electric vehicle has no engine and no start-stop system, but has a large quantity of power electronic apparatuses such as a battery, a motor, an electrically-controlled core component, an electric air conditioner drive, and an on-board charger. These apparatuses may convert electric energy, stored in a power battery, into electric energy required for driving the motor, an automotive low-voltage power device, an air conditioner motor, or the like, and the electric energy cannot be controlled or converted without a power semiconductor.

A requirement of the electric vehicle on a large quantity of power semiconductors promotes development of a power semiconductor integration technology, and a power module is a development product of the power semiconductor integration technology. The power module is a module formed after power electronic devices combined based on a specific function and then encapsulated. Different power modules also have different functions in different circuit systems, for example, functions such as transformation, inversion, and frequency conversion. For example, an electrically-driven power module is used as a drive apparatus, and a power electronic apparatus included in the power module is mainly an insulated gate bipolar transistor (IGBT). The IGBT is characterized by a low on-state voltage drop, a high withstand voltage, and a high output power, and is a power device that is conducted through voltage drive. The electrically-driven power module is used in an inverter. In this case, after a direct current provided by a battery is converted into an alternating current, the alternating current is transmitted to a motor based on an electromagnetic induction principle. Then, the motor converts electric energy into a mechanical energy, to drive a wheel to proceed.

In a working process, the power module inevitably generates heat. Therefore, transmission efficiency first needs to be considered when the power module is designed, to reduce power consumption as much as possible, and improve transmission performance. In addition, due to heat accumulation caused by a high voltage and a high current in the power module, the power module is very likely to be burned or broken down. Therefore, heat dissipation of the power module further needs to be considered, to improve heat dissipation performance. In addition, an arrangement of the power module and another device further needs to meet a compact design.

Based on the foregoing design requirement, a power density of the power module is further improved. Currently, increasingly more manufacturers choose to combine the power module and a cooler into a whole. Generally, the electric vehicle uses a liquid cooler. If the power module is connected to the liquid cooler, heat dissipation performance of the power module may be greatly improved, and a structure of the vehicle is more compact. Specifically, the power module and a fluid path of the cooler may be sealed by using a welding technology or through sealing and crimping, to form a whole. The following briefly describes the process.

FIG. 1 is a schematic diagram of a structure of an encapsulation structure of a power module according to an embodiment of this application. Generally, although an integrated welding manner has high reliability, many power module chips have plastic housings, and cannot withstand an excessively high temperature. Therefore, a commonly used welding manner is to perform local high-energy heating by using a laser beam, to establish a welding pool and a welding region. However, during laser welding, a complete and closed processing path is required to ensure that the laser beam is not blocked. Because a power pin and a power busbar of the power module chip each have a connection requirement, and the pin needs to extend from a side, processing cannot be performed locally. Therefore, a cooler needs to be detached into two parts. First, the power module chip and a framework of the cooler are welded together. Then, a fluid path and a cover of the cooler are welded to the framework to form a whole. It should be noted that heat accumulation needs to be controlled in an entire process of laser processing. This can ensure that the power module chip is prevented from being damaged due to an excessively high temperature.

Specifically, as shown in FIG. 1, a heat dissipation baseplate exists on a back side of the power module chip, and metal exposed around the heat dissipation baseplate and a framework of a liquid cooler are lapped together, and are welded together through the first time of laser welding. Then, the framework of the cooler and a cover of the cooler are welded together through the second time of laser welding. After the framework and the cover are welded, a liquid outlet and a liquid inlet are welded to the cover, to complete a welding process.

When a complete sealing structure is formed through laser welding, a high requirement is imposed on a technology, a parameter, and the like, and a disadvantage such as porosity and a blowhole is easily generated in the welding process. In the foregoing welding structure, because laser welding needs to be performed a plurality of times, a risk of generating a welding disadvantage is greatly increased. In addition, the cooler is split into a plurality of parts. When a sealed whole is obtained through assembling, a welding distance is very long, there are an excessively large quantity of welds, fastening is difficult in an intermediate process, and technology deformation is difficult to control. This affects reliability of the welding structure, and makes a welding technology very complex.

Another commonly used method is to seal the power module and the fluid path of the cooler into a whole through sealing and crimping. Specifically, a metal baseplate of the power module protrudes from a power module body. During encapsulation, a sealing ring is first added between the metal baseplate and a sealing ring groove of the cooler structure. Then, the power module and the cooler are connected together by using a screw, a damper, or the like, so that the sealing ring is tightly pressed against the power module and the cooler to form a sealed fluid path.

In the foregoing structure, the sealing ring is extruded and deformed. Although the sealing ring can withstand specified pressure to complete sealing and encapsulation, due to aging of the sealing ring, the sealing ring is hardened and cracked to generate a gap, or the cooler is deformed to generate a gap. Consequently, local leakage is generated, the sealed fluid path cannot be obtained, and a risk of an electrical short circuit is caused. In addition, the power module chip or the cooler is also deformed during use. Consequently, pressure at a sealed part is released, and a risk of liquid and gas leakage is generated. In addition, loosening of a damper and a screw fastening apparatus also causes insufficient sealing and pressing, and a risk of liquid and gas leakage is generated. Therefore, reliability of a sealed structure obtained by using the sealing ring is very low. How to encapsulate the power module and the cooler to obtain a reliable sealed structure is a problem that needs to be urgently resolved.

According to the encapsulation structure and the encapsulation method of a power module in embodiments of this application, structures of the power module and the cooler are modified, so that encapsulation is completed by performing one time of laser welding (processing is performed on a front side and a back side simultaneously or separately). In this way, the power module and the cooler may be encapsulated into a whole by using a relatively small quantity of welds whose lengths are relatively short, and a complete and reliable sealed fluid path may be formed between the power module and the cooler after welding. This improves sealing performance of an entire welding structure, and greatly reduces a risk of liquid and gas leakage.

Figure 2A:
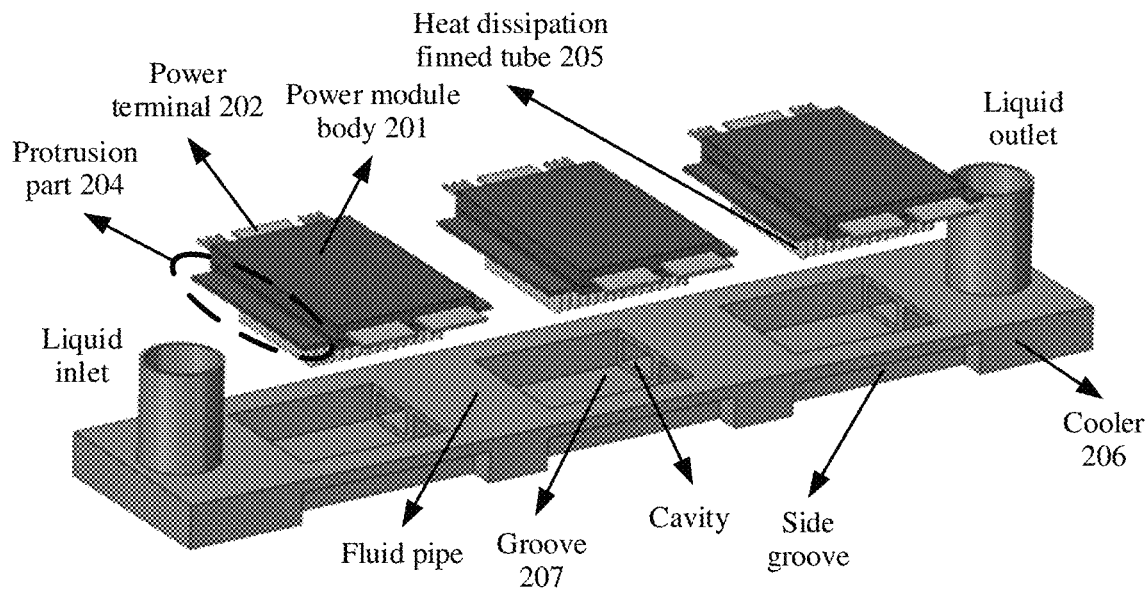
FIG. 2A is a schematic diagram of a structure of an encapsulation structure of a power module according to an embodiment of this application.

FIG. 2A is a schematic diagram of a structure of an encapsulation structure of a power module according to an embodiment of this application. As shown in FIG. 2A, a power module body 201 is a cuboid, and two short-edge ends each include a power terminal 202 configured to be connected to an external circuit system. A metal baseplate is connected to a back side of the power module body 201, and a length of a short edge of the metal baseplate is greater than a length of a short edge of the power module body 201. In this case, the metal baseplate has a protrusion part 204 protruding from the power module body 201, that is, two long-edge sides of the power module body 201 each have an exposed protrusion part 204. The protrusion part 204 is configured to provide a welding side for front welding.

Figure 2B:
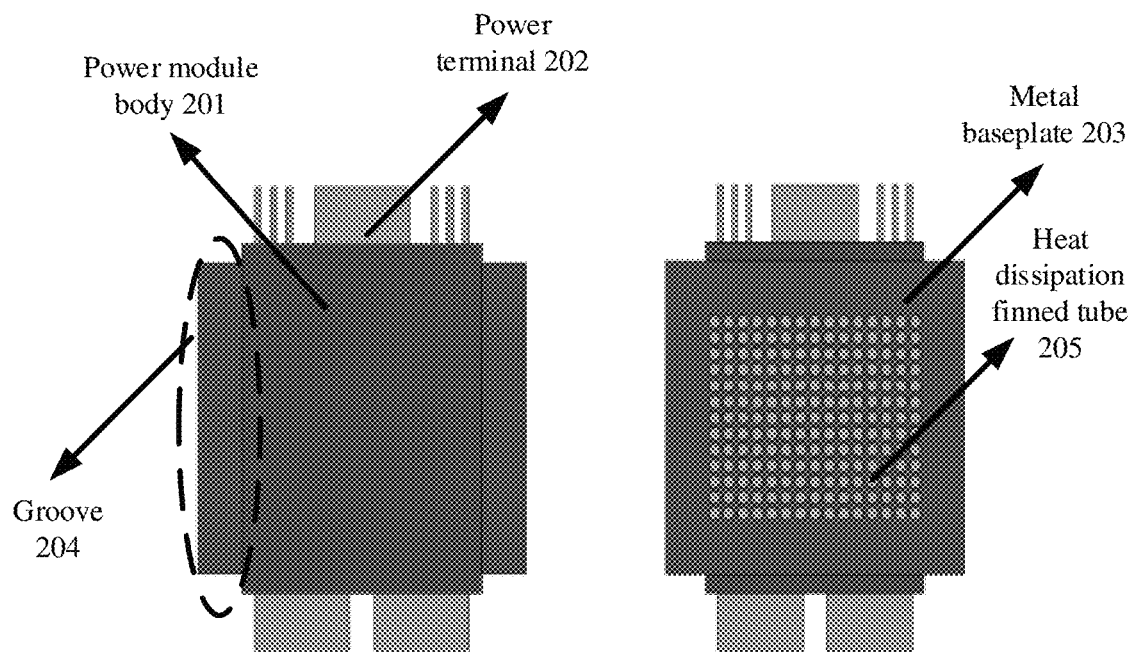
FIG. 2B is a schematic diagram of a structure of a power module according to an embodiment of this application.

To display a position of the metal baseplate more clearly, FIG. 2B is a schematic diagram of a structure of a power module according to an embodiment of this application. As shown in FIG. 2B, the power module includes the power module body 201, the power terminal 202, the metal baseplate 203, and heat dissipation finned tubes 205. It may be learned from FIG. 2B that the metal baseplate 203 bears the entire power module, and the metal baseplate 203 has a protrusion structure protruding from the power module body 201, where a front side of the protrusion structure is the protrusion part 204.

A front side of the metal baseplate 203 is connected to the power module body 201, a back side thereof is connected to the heat dissipation finned tubes 205, and the heat dissipation finned tube 205 is configured to implement heat exchange, to improve heat dissipation performance of the power module. The heat dissipation finned tubes 205 may be arranged in a matrix to facilitate subsequent welding to form a welded sealing ring. The heat dissipation finned tube 205 may be a circular finned tube, a conical finned tube, or a rhombic finned tube. This is not specifically limited.

Figure 3A:
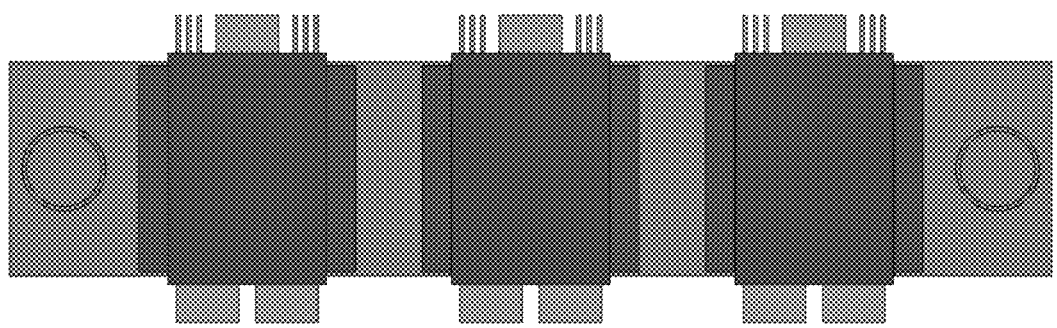
FIG. 3A is a top view of an encapsulation structure of a power module according to an embodiment of this application.
Figure 3B:
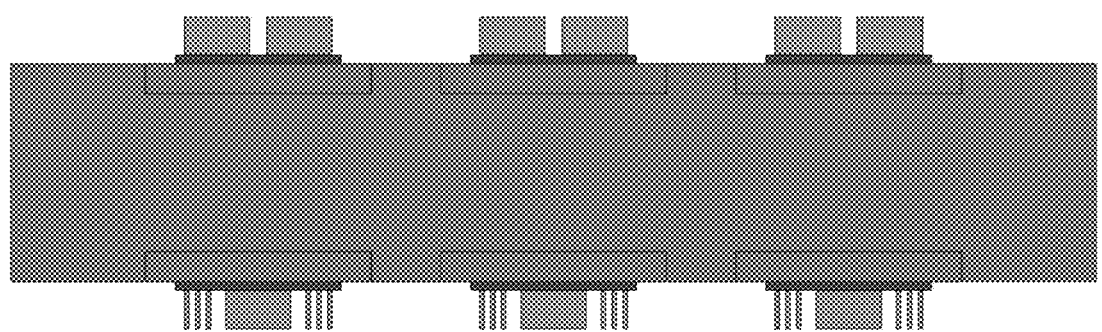
FIG. 3B is a bottom view of an encapsulation structure of a power module according to an embodiment of this application.
Figure 3C:
FIG. 3C is a main view of an encapsulation structure of a power module according to an embodiment of this application.

A cooler 206 is an integrated structure formed by using a technology such as brazing and mechanical treatment in advance. The cooler 206 is in contact with the heat dissipation finned tubes of the power module by using heat dissipation liquid flowing in a fluid path, to implement heat exchange. The cooler includes the fluid path, a liquid outlet, and a liquid inlet. It may be learned from FIG. 2A that the liquid outlet, the liquid inlet, and the fluid path are an integrated structure, and a part other than a groove 207 on the fluid path is a closed structure. The groove 207 has a specified depth, and there is a cavity between two adjacent grooves. In this way, the grooves 207 communicate with each other, to facilitate flow of the heat dissipation liquid. A function of the groove 207 is to assemble the cooler 206 and the power module together. Specifically, the power module body 201 needs to be lapped on the groove 207, so that the protrusion pall 204 is in contact with an edge surface of the groove 207, and the heat dissipation finned tubes 205 are exactly inserted into the groove 207 on the fluid path, to form a complete embedded combination structure. The combination structure is shown in FIG. 3A, FIG. 3B, and FIG. 3C. FIG. 3A is a top view of the embedded combination structure, FIG. 3B is a bottom view of the embedded combination structure, and FIG. 3C is a main view of the embedded combination structure.

After the embedded combination structure is obtained through lapping, the embedded combination structure needs to be welded by using a welding technology, to form a complete sealed structure. Before descriptions are provided, the following is first specified: In the power module structure, a side that is of the metal baseplate 203 and that is connected to the heat dissipation finned tubes 205 is the back side of the metal baseplate 203, and a side that is of the metal baseplate 203 and that is connected to the power module body 201 is the front side of the metal baseplate 203. It may be understood that, in the following embodiments, descriptions of the front side and the back side all meet the foregoing specification, and details are not described again.

Figure 4A:
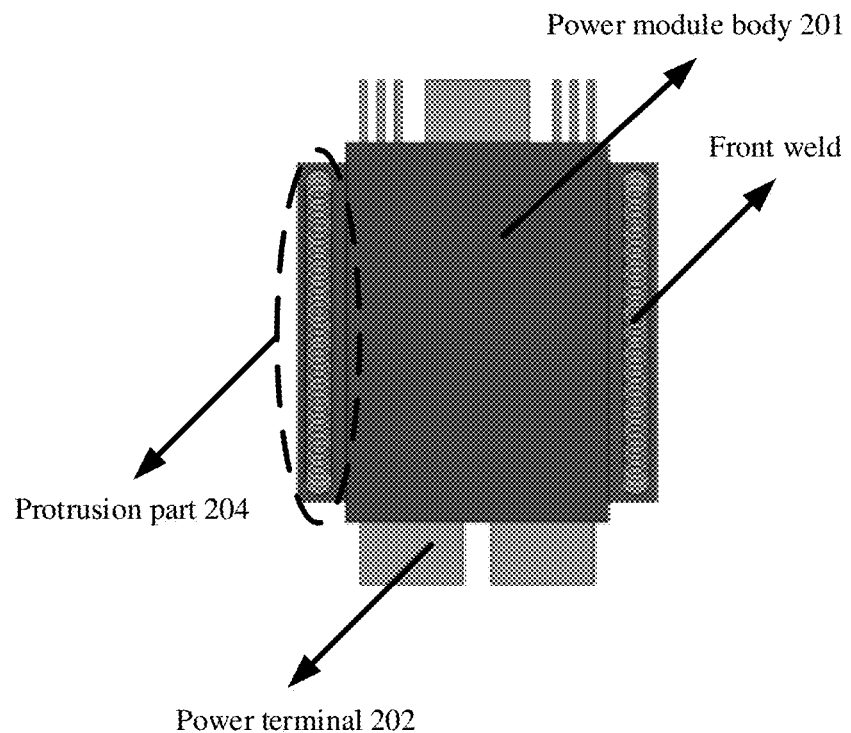
FIG. 4A is a top view of a power module according to an embodiment of this application.

In a welding process, front welding first needs to be performed to fasten the power module and the cooler 206. It may be understood that, because two sides of the power module body 201 that have the power terminal 202 cannot provide a welding side required for front welding, the welding side for front welding is the protrusion part 204 protruding from the power module body 201. One power module is used as an example. FIG. 4A is a top view of a power module according to an embodiment of this application. As shown in FIG. 4A, in the top view, the power terminal 202 exists on each of a third side and a fourth side of the power module body 201, and the protrusion part 204 of the metal baseplate 203 exists on each of the first side and the second side of the power module body 201. In this case, the protrusion part 204 needs to be used as the welding side for front welding, and a front weld is obtained through welding such as high-energy laser heating. It may be understood that parallel welds may be obtained through welding on the protrusion parts 204 on the third side and the fourth side, and there may be one or more welds on each side. This is not specifically limited.

It may be understood that the parallel welds herein do not mean that the welds are absolutely parallel, but mean that directions of the two welds are consistent, and are intended to finally form a sealing ring. Therefore, unparallel welds, a bent weld line, and the like in the welding process may be included in a scope of the parallel welds, provided that a weld that facilitates front processing is formed. In addition, a position of front processing is affected by a distribution position of the power terminal 202. Therefore, if the power terminal 202 on the power module body 201 is distributed only on one side, the metal baseplate 203 may have three protrusion parts protruding from the other three sides, that is, the three sides other than the side having the power terminal 202 each have a protrusion part 204. In this way, the protrusion parts 204 on the three sides each may be used as the welding side for front welding, to obtain a U-shaped front weld by processing the protrusion parts 204 on the three sides through front welding. In other words, when the front weld is obtained by performing processing through front welding, only one side on which the power terminal 202 is distributed needs to be avoided. This is not specifically limited.

Figure 4B:
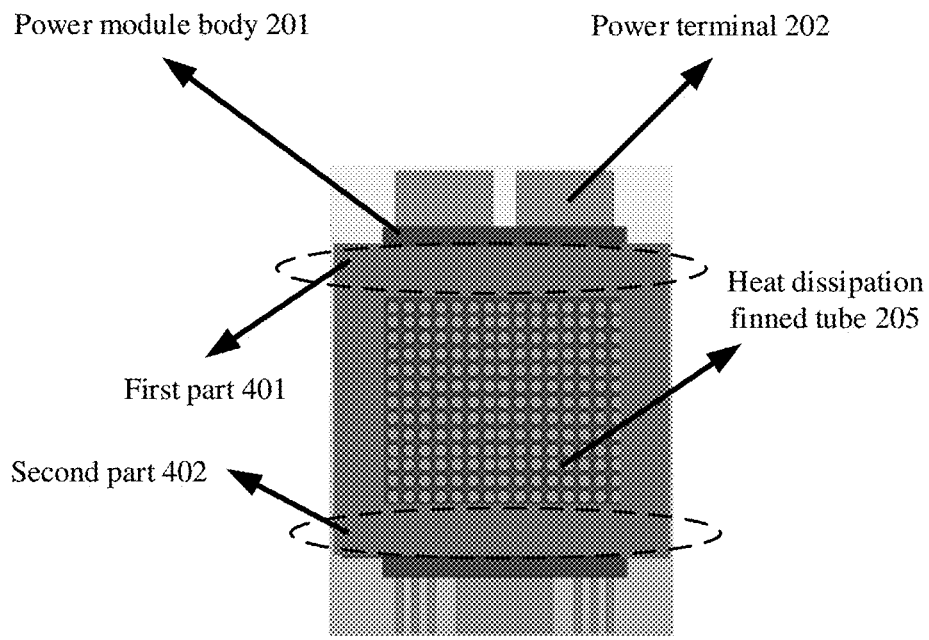
FIG. 4B is a bottom view of a power module according to an embodiment of this application.
Figure 5:
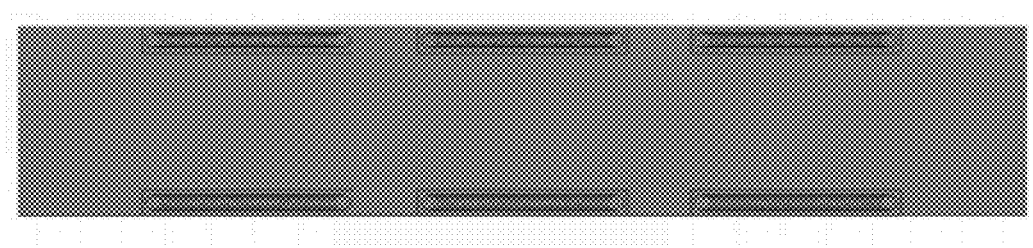
FIG. 5 is a bottom view of an encapsulation structure of a power module according to an embodiment of this application.

After the front weld is obtained through processing, the side having the power terminal 202 is not sealed, that is, front welding fails to form a complete sealing ring. Because existence of the power terminal 202 makes front welding almost impossible, back welding needs to be performed to seal the side having the power terminal 202, so as to form a complete sealing ring. FIG. 4B is a bottom view of a power module according to an embodiment of this application. As shown in FIG. 4B, the heat dissipation finned tubes 205 arranged in a matrix are connected to the back side of the metal baseplate 203. The heat dissipation finned tubes 205 are inserted into the groove 207 of the cooler 206, and a metal surface having no heat dissipation finned tube 205 is lapped on a surface of the fluid pipe of the cooler 206, to provide a welding side for back welding. The back side of the metal baseplate 203 includes a first part 401 and a second part 402. In the embedded structure, the first part 401 is close to the third side of the power module body 201, and the second part 402 is close to the fourth side of the power module body 201. Both the first part 401 and the second part 402 are in contact with the edge surface of the groove 207. Because the third side and the fourth side of the power module body 201 each have a power terminal 202, the first part 401 and the second part 402 need to be processed through back welding to form back welds, so as to finally form the metal baseplate 203 and the fluid pipe into a whole. When seen from a back side of the cooler 206, the back weld is shown in FIG. 5.

It may be understood that, to reduce a difficulty of the back welding, thinning processing may be performed on a region that is on the cooler and in which back processing is performed. As shown in FIG. 2A, a side of the cooler 206 has a side groove, to thin a welding side on the cooler 206, reduce a difficulty of back welding, and prevent back welding from being incapable of being performed because a thickness of the cooler is excessively large.

Figure 6:
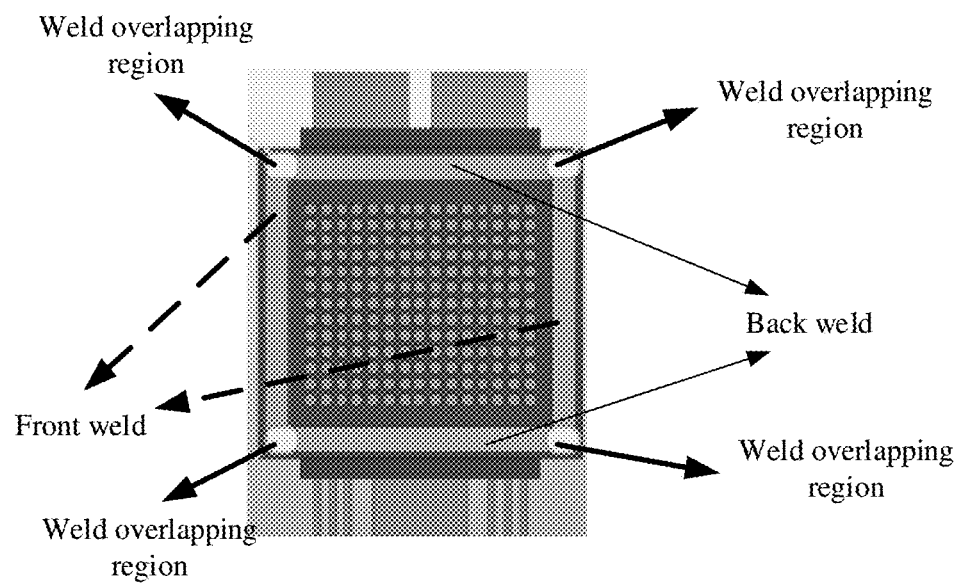
FIG. 6 is a bottom view of another power module according to an embodiment of this application.

The front welds obtained through front processing and the back welds obtained through back processing need to overlap, so that a sealing ring can be formed to avoid leakage. FIG. 6 is a bottom view of another power module according to an embodiment of this application. As shown in FIG. 6, after front welding and back welding are performed on the power module, two front welds and two back welds are formed. Fusion regions of the front welds and the back welds overlap to form four weld overlapping regions. In this way, the four welds surround a complete welded sealing ring, so that the groove on the cooler 206 is fully sealed, and a complete sealed fluid path is formed between the power module and the cooler. In this way, local leakage can be avoided, so that the power module and the cooler are integrated, and reliability of the entire encapsulation structure is improved.

Figure 7:
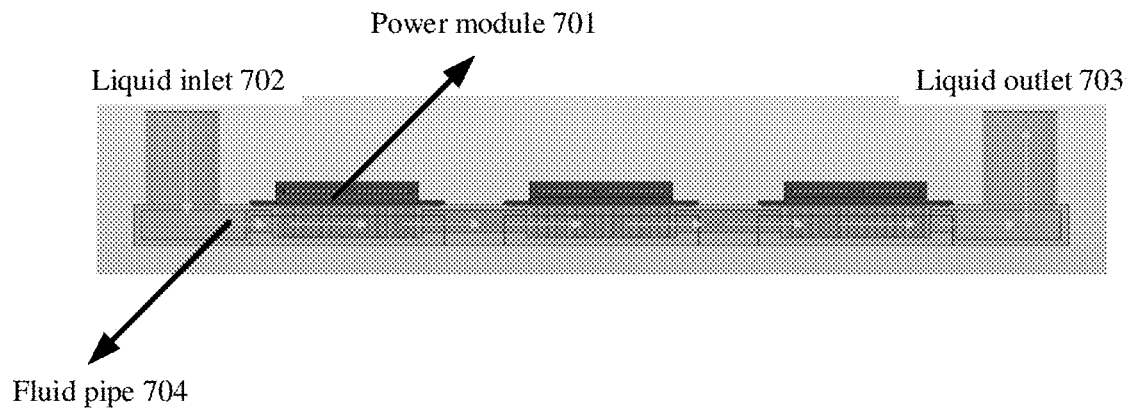
FIG. 7 is a schematic diagram of a structure of an encapsulation structure of a power module according to an embodiment of this application.

After welding is completed, an encapsulation structure shown in FIG. 7 is obtained. FIG. 7 is a schematic diagram of a structure of an encapsulation structure of a power module according to an embodiment of this application. The encapsulation structure includes a power module 701, a liquid inlet 702, a liquid outlet 703, and a fluid pipe 704. Heat dissipation finned tubes included in the power module 701 are embedded in a groove on the fluid pipe 704. The groove is sealed by using a welding technology, and the encapsulation structure has a complete and closed fluid pipe 704. When a cooler in the encapsulation structure works, refrigeration liquid flows into the encapsulation structure through the liquid inlet 702, flows through the fluid pipe 704, and finally flows out of the encapsulation structure through the liquid outlet 703. A direction indicated by an arrow in the figure is a liquid flow direction. The heat dissipation finned tubes are in direct contact with the heat dissipation liquid, and heat is removed by using the flowing liquid. In this way, an effect of quickly cooling the power module 701 can be achieved, to improve heat dissipation performance of the power module 701.

To ensure the embedded combination of the power module and the cooler, the following describes a material requirement of each part.

First, a material of the metal baseplate corresponding to the power module may be copper Cu, aluminum Al, or aluminum silicon carbide AlSiC, copper silicon carbide, aluminum diamond, or the like. In a detailed description, a thickness of the metal baseplate needs to be controlled between 1 millimeter and 5 millimeters. Optionally, aluminum plating, copper plating, nickel plating, or the like may be performed on an outer surface of the metal baseplate.

Second, a size of the protrusion part protruding from the power module body is also required to ensure that there is a sufficient welding side for front welding. Optionally, it needs to be ensured that a width of a protrusion part on each side is greater than 2 millimeters, and a thickness of the protrusion part on each side needs to be between 0.5 millimeter and 4 millimeters. If the thickness of the protrusion part is excessively large, a difficulty of front welding is increased. If it is ensured that the thickness is between 0.5 millimeter and 4 millimeters, the difficulty of front welding may be reduced, and welding efficiency may be improved.

The heat dissipation finned tubes mounted on the back side of the metal baseplate are distributed in a rectangle, and the heat dissipation finned tube may be in a plurality of shapes, including a circular finned tube, a conical finned tube, or a rhombic finned tube. This is not specifically limited. However, because the heat dissipation finned tubes need to be embedded in the groove on the fluid pipe of the liquid cooler, a size of the groove needs to match a size of a matrix-type heat dissipation finned tube. Specifically, the size of the groove needs to be slightly greater than a size of a rectangle corresponding to the heat dissipation finned tube. Preferably, a length and a width of the groove are respectively 0.2 millimeter to 1 millimeter greater than a length and a width of the rectangle. A depth of the groove is 0.05 millimeter to 0.3 millimeter greater than a height of the heat dissipation finned tube. In this way, it may be ensured that the heat dissipation finned tubes can be fully embedded in the groove. In addition, when the groove is full of the heat dissipation liquid, the heat dissipation liquid exactly submerges the heat dissipation finned tubes. If the groove is excessively deep, when the groove is full of the heat dissipation liquid, partial heat dissipation liquid cannot be in contact with the heat dissipation finned tubes. This causes waste of partial heat dissipation liquid. Therefore, if the depth of the groove is designed to be slightly greater than the height of the heat dissipation finned tube, the heat dissipation liquid can be saved, and heat dissipation efficiency can be improved.

A framework of the liquid cooler may be Al, Cu, and the like, and a surface of the fluid pipe may be a body Al, or nickel plating may be performed on the body. This is not specifically limited. For a part that is used for back welding and that is lapped on the power module, it needs to be ensured that a width of the part is greater than 2 millimeters, that is, the liquid cooler needs to provide a sufficiently large welding side. In addition, thinning processing further needs to be performed on the welding side, so that a thickness can be between 0.5 millimeter and 4 millimeters, to reduce the difficulty of back welding.

The protrusion part on the metal baseplate needs to be in contact with the edge surface of the groove on the fluid pipe, and the contact part is also a welding side for front welding. Therefore, a thickness of a metal layer on the liquid cooler at a position corresponding to the edge surface needs to be between 1 millimeter and 3 millimeters. To ensure that the welding side has sufficient strength support during welding, one or more ribs may be further disposed at the position, to improve material strength and meet a welding requirement. However, it should be noted that the rib does not affect flow of the liquid in the cooler, and it needs to be ensured that the heat dissipation liquid smoothly flows.

In the welding process, preferably, the front weld may reach a vertex edge of the metal baseplate of the power module, and the back weld may also reach the vertex edge of the module. In this way, a length of the weld is larger, and sealing performance is better. A width of the weld needs to be greater than 2 millimeters, and a depth of the weld needs to reach half the thickness of the welding side. This may improve sealing reliability of the welding structure.

In the foregoing encapsulation structure of a power module, the power module corresponds to the metal baseplate, and the heat dissipation finned tubes are mounted on the back side of the metal baseplate. The heat dissipation finned tubes may be embedded in the groove on the fluid pipe of the liquid cooler, and the protrusion part included in the metal baseplate is lapped on the fluid pipe (the edge surface of the groove). In this way, the power module and the liquid cooler may be encapsulated into a whole by combining front welding and back welding, and a complete and reliable sealed fluid path is formed between the power module and the liquid cooler. In addition, when front welding and back welding are combined, a welding difficulty problem caused due to existence of the power terminal may be avoided. In addition, the liquid cooler is a structure in which a part other than the groove, the liquid inlet, and the liquid outlet is closed. In this way, welding needs to be performed only around the groove, a welding distance is small, and a risk of a welding heat effect, welding deformation, a welding disadvantage, and the like is reduced. Therefore, sealing performance of the entire welding structure is good, and a risk of liquid and gas leakage and processing costs are greatly reduced.

Figure 8:
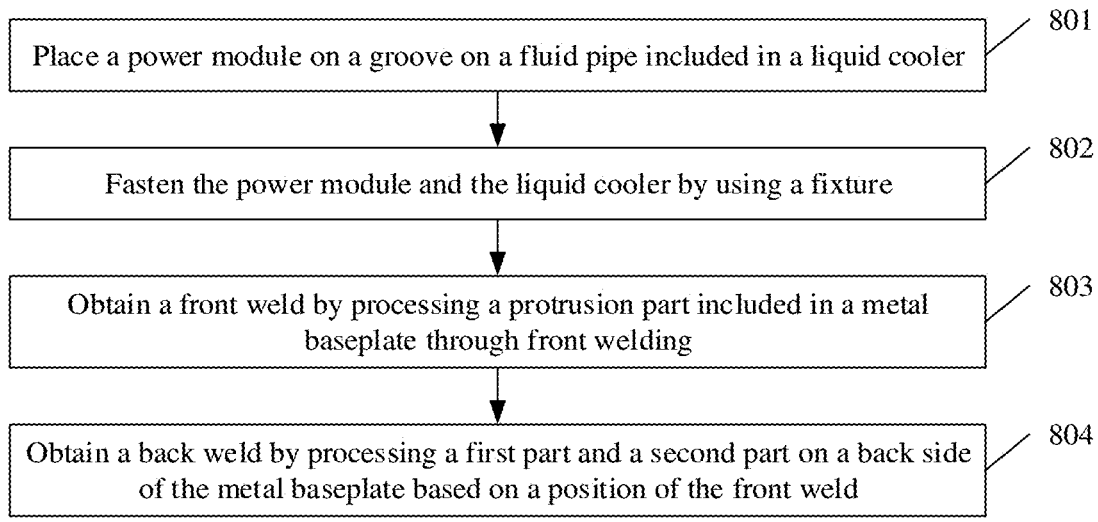
FIG. 8 is a schematic flowchart of an encapsulation method of a power module according to an embodiment of this application.

FIG. 8 is a schematic flowchart of an encapsulation method of a power module according to an embodiment of this application. As shown in FIG. 8, the encapsulation method includes the following steps.

801. Place the power module on a groove on a fluid pipe included in a liquid cooler.

The power module includes a power module body, a metal baseplate, and heat dissipation finned tubes. A power terminal exists on the body, a front side of the metal baseplate is connected to the power module body, and a back side thereof is connected to the heat dissipation finned tubes. In addition, a size of the metal baseplate is greater than a size of the power module body, and the metal baseplate has a protrusion part protruding from the power module body. For a specific structure, refer to content of the power module in the embodiments shown in FIG. 2A to FIG. 7. Details are not described herein again.

A structure of the liquid cooler matches a structure of the power module. The liquid cooler includes a liquid inlet, a liquid outlet, and a fluid pipe, the fluid pipe has grooves, and the groove is configured to place the heat dissipation finned tubes of the power module. In addition, a cavity exists between two adjacent grooves, and the cavity is configured to communicate a plurality of grooves to provide a loop for heat dissipation liquid. It may be understood that a part on the liquid cooler other than the groove, the liquid outlet, and the liquid inlet is closed. For a specific structure, refer to content of the cooler in the embodiments shown in FIG. 2A to FIG. 7. Details are not described herein again.

When the power module and the liquid cooler are assembled, the power module body needs to be placed on the groove. In this way, the heat dissipation finned tubes are exactly embedded in the groove. Then, an edge of the groove is sealed by using a welding technology, so that the power module and the liquid cooler can be welded into a whole to obtain a sealed fluid path.

802. Fasten the power module and the liquid cooler by using a fixture.

After the power module is placed, the power module and the liquid cooler need to be fastened by using the fixture. This step is used to prepare for a welding step. When a position is fixed by using the fixture, displacement in a welding process may be avoided, and welding accuracy may be improved.

803. Obtain a front weld by processing the protrusion part included in the metal baseplate through front welding.

Specifically, the exposed metal baseplate (protrusion part) is lapped on an edge surface of the groove on the fluid pipe. In this way, the protrusion part may be used as a welding side for front welding, to form the front weld by performing processing through front welding. A width of a protrusion part on each side needs to be greater than 2 millimeters to ensure that there is a sufficiently large welding side for processing. In addition, a thickness of the protrusion part needs to be between 0.5 millimeter and 4 millimeters to ensure strength required for welding. If necessary, one or more ribs may be disposed on the protrusion part to enhance strength of the protrusion part and enhance strength of the welding side for front welding.

804. Obtain a back weld by processing a first part and a second part on the back side of the metal baseplate based on a position of the front weld.

Because the power terminal exists in the power module, it is difficult to perform front welding on a side having the power terminal. Therefore, a back welding method may be used to form a sealing ring. For example, if the power terminal is located on a third side and a fourth side of the power module body, the protrusion part is located on a first side and a second side of the power module body. The first part and the second part exist at the bottom of the metal baseplate. The first part is close to the third side, the second part is close to the fourth side, and there is no heat dissipation finned tube on the first part and the second part. In this case, the back weld may be obtained by processing the first part and the second part based on a direction from the fluid pipe to the metal baseplate, and it needs to be ensured that the formed back weld overlaps the front weld on the protrusion part, to form a complete welded sealing ring. In other words, the groove on the fluid pipe is sealed by the power module, and the heat dissipation finned tubes of the power module are placed in the groove. In this way, when the power module and the cooler are combined into a whole, a complete and closed fluid path is provided. In addition, the heat dissipation finned tubes are in direct contact with the heat dissipation liquid, so that the heat dissipation liquid can quickly take away heat generated by the power module, to improve a heat dissipation capability of the power module.

For example, the protrusion part on each side serves as the welding side for front welding. Preferably, the width needs to be greater than 2 millimeters to ensure that the welding side is sufficiently large, and the thickness needs to be between 0.5 millimeter and 4 millimeters to ensure strength required during welding.

Widths of the front weld and the back weld need to be at least 0.5 millimeter. In this way, reliability of the sealing ring can be ensured, a short circuit of the power module caused by liquid and gas leakage is greatly reduced, and safety of an entire encapsulation system is improved.

In addition, in the foregoing process, a processing manner of either front welding or back welding may be high-energy laser processing, friction stir welding processing, or ultrasonic welding processing. This is not specifically limited. In addition, after welding, an ultrasonic detection technology may be further used to detect whether the welding side is complete, to ensure air tightness and structural strength of an entire result.

In the foregoing encapsulation method of a power module, the power module corresponds to the metal baseplate, and the heat dissipation finned tubes are mounted on the back side of the metal baseplate. The heat dissipation finned tubes may be embedded in the groove of the cooler, and the metal baseplate is lapped on the edge surface of the groove. Then, the front weld obtained through front welding and the back weld obtained through back welding are combined into the sealing ring, and the complete and reliable sealed fluid path is formed between the power module and the cooler. In addition, when both front welding and back welding are used, a welding difficulty problem caused due to existence of the power terminal may be avoided. In addition, the cooler is a whole, and a part other than the groove is a closed structure. In this way, welding needs to be performed only around the groove, a welding distance is small, and a welding risk is low. Therefore, sealing performance of the entire welding structure is good, and a risk of liquid and gas leakage is greatly reduced.

An embodiment of this application further provides an inverter, including the encapsulation structure of a power module shown in any one of the foregoing embodiments shown in FIG. 2A to FIG. 7. The inverter may convert a direct current into an alternating current, and may be used in various frequency conversion circuits, rectifier circuits, inverter circuits, or control circuits. This is not specifically limited.

An embodiment of this application further provides an alternating current motor drive system. The alternating current motor drive system includes a direct current power supply, an inverter, and an alternating current motor. One side of the inverter is connected to the direct current power supply, and the other side thereof is connected to the alternating current motor. The inverter includes the encapsulation structure of a power module shown in any one of the foregoing embodiments shown in FIG. 2A to FIG. 7. The inverter is configured to: convert, into an alternating current, a direct current provided by the direct current power supply, and provide the alternating current for the alternating current motor, to control a rotation speed of the alternating current motor.

The technical terms used in embodiments of the present invention are merely used to describe specific embodiments, but are not intended to limit the present invention. In this specification, singular forms "one", "this", and "the" are intended to simultaneously include plural forms unless otherwise specified in the context clearly. Further, the term "include" and/or "contain" used in this specification means presence of features, entireties, steps, operations, elements, and/or components, but does not preclude presence or addition of one or more other features, entireties, steps, operations, elements, and/or components.

In the appended claims, the corresponding structures, materials, actions, and equivalent forms (if any) of all apparatuses or steps and function elements are intended to include any structure, material, or action that is used to perform the function with reference to other explicitly required elements. The descriptions of the present invention are provided for the purpose of the embodiments and the descriptions, but are not intended to be exhaustive or limit the present invention to the disclosed form.

What is claimed is:

1. An encapsulation structure, comprising:
a power module, comprising:
a power module body;
a metal baseplate; and
heat dissipation finned tubes, wherein a front side of the metal baseplate is connected to the power module body, and a back side of the metal baseplate is connected to the heat dissipation finned tubes, and a protrusion of the metal baseplate protrudes from the power module body; and
a liquid cooler, wherein a plurality of grooves extend in a fluid pipe of the liquid cooler, a cavity is between two adjacent grooves of the plurality of grooves, and the cavity is configured to communicate between the two adjacent grooves; and
wherein the power module body is disposed on a first groove of the plurality of grooves, a back side of the protrusion is in contact with an edge surface of the first groove, and the heat dissipation finned tubes are placed in the first groove, a front weld is on a front side of the protrusion, a back weld is on the back side of the metal baseplate other than the back side of the protrusion, and the front weld and the back weld form a welded sealing ring.

2. The encapsulation structure according to claim 1, wherein the power module body further comprises a power pin, and the power pin is located on a side of the power module body other than a side on which the protrusion is located.

3. The encapsulation structure according to claim 2, wherein the protrusion is located on a first side and a second side of the power module body, and the power pin is located on a third side and a fourth side of the power module body; and
wherein a plane on which the first side is located is parallel to a plane on which the second side is located, a plane on which the third side is located is parallel to a plane on which the fourth side is located, and the plane on which the first side is located is perpendicular to the plane on which the third side is located.

4. The encapsulation structure according to claim 3, wherein the back weld is on a first part and a second part of the back side of the metal baseplate, the first part is adjacent to the third side, and the second part is adjacent to the fourth side, and wherein the first part and the second part respectively overlap the back side of the protrusion.

5. The encapsulation structure according to claim 4, wherein widths of the protrusion, the first part, and the second part are all between 4 millimeters and 12 millimeters, and thicknesses of the protrusion, the first part, and the second part are all between 0.5 millimeter and 4 millimeters.

6. The encapsulation structure according to claim 1, wherein the encapsulation structure further comprises at least one rib, and the at least one rib is disposed on the front side of the protrusion and is configured to enhance a strength of the protrusion.

7. The encapsulation structure according to claim 1, wherein widths of the front weld and the back weld each are greater than or equal to 2 millimeters.

8. The encapsulation structure according to claim 1, wherein the heat dissipation finned tubes are distributed in a rectangle, and the heat dissipation finned tube is a circular finned tube, a conical finned tube, or a rhombic finned tube.

9. A method, comprising:
placing a power module body comprised in a power module on a first groove, the first groove extending in a fluid pipe comprised in a liquid cooler, the power module body being placed on the first groove in a manner that a back side of a protrusion of a metal baseplate comprised in the power module is in contact with an edge surface of the first groove, and heat dissipation finned tubes comprised in the power module are placed in the first groove, wherein a front side of the metal baseplate is connected to the power module body, a back side of the metal baseplate is connected to the heat dissipation finned tubes, and the protrusion of the metal baseplate protrudes from the power module body;
fastening the power module and the liquid cooler using a fixture, wherein a plurality of grooves extend in the fluid pipe of the liquid cooler, the plurality of grooves includes the first groove, a cavity is between two adjacent grooves of the plurality of grooves, and the cavity is configured to communicate between the two adjacent grooves;
processing a front weld on a front side of the protrusion; and
processing a back weld on a part on the back side of the metal baseplate other than the back side of the protrusion, wherein the front weld and the back weld form a welded sealing ring.

10. The method according to claim 9, wherein the power module body further comprises a power pin, and the power pin is located on a side of the power module body other than a side on which the protrusion is located.

11. The method according to claim 10, wherein the protrusion is located on a first side and a second side of the power module body, and the power pin is located on a third side and a fourth side of the power module body; and
wherein a plane on which the first side is located is parallel to a plane on which the second side is located, a plane on which the third side is located is parallel to a plane on which the fourth side is located, and the plane on which the first side is located is perpendicular to the plane on which the third side is located.

12. The method according to claim 11, wherein the back weld exists on a first part and a second part of the back side of the metal baseplate, the first part is adjacent to the third side, and the second part is adjacent to the fourth side, and the first part and the second part respectively overlap the back side of the protrusion.

13. The method according to claim 12, wherein widths of the protrusion, the first part, and the second part are all between 4 millimeters and 12 millimeters, and thicknesses of the protrusion, the first part, and the second part are all between 0.5 millimeter and 4 millimeters.

14. The method according to claim 9, wherein before processing the front weld on the front side of the protrusion, the method further comprises:
disposing at least one rib on the front side of the protrusion, wherein the at least one rib is configured to enhance strength of the protrusion.

15. The method according to claim 9, wherein widths of the front weld and the back weld each are greater than or equal to 2 millimeters.

16. The method according to claim 9, wherein the heat dissipation finned tubes are distributed in a rectangle, and the heat dissipation finned tube is a circular finned tube, a conical finned tube, or a rhombic finned tube.

17. The method according to claim 9, wherein a processing manner of each of the front weld and the back weld is high-energy laser processing, friction stir welding processing, or ultrasonic welding processing.

18. An inverter, comprising:
an encapsulation structure, wherein the encapsulation structure comprises a power module and a liquid cooler;
wherein the inverter is configured to convert a direct current into an alternating current;
wherein the power module comprises a power module body, a metal baseplate, and heat dissipation finned tubes, wherein a front side of the metal baseplate is connected to the power module body, a back side of the metal baseplate is connected to the heat dissipation finned tubes, and a protrusion of the metal baseplate protrudes from the power module body;
wherein a plurality of grooves extend in a fluid pipe of the liquid cooler, a cavity is between two adjacent grooves of the plurality of grooves, and the cavity is configured to communicate between the two adjacent grooves; and
wherein the power module body is disposed on a first groove of the plurality of grooves, a back side of the protrusion is in contact with an edge surface of the first groove, and the heat dissipation finned tubes are placed in the first groove, a front weld exists on a front side of the protrusion, a back weld exists on the back side of the metal baseplate other than the back side of the protrusion, and the front weld and the back weld form a welded sealing ring.

19. The inverter according to claim 18, wherein the power module body further comprises a power pin, and the power pin is located on a side of the power module body other than a side on which the protrusion is located.

20. The inverter according to claim 19, wherein the protrusion is located on a first side and a second side of the power module body, and the power pin is located on a third side and a fourth side of the power module body; and
wherein a plane on which the first side is located is parallel to a plane on which the second side is located, a plane on which the third side is located is parallel to a plane on which the fourth side is located, and the plane on which the first side is located is perpendicular to the plane on which the third side is located.

* * * * *